US010930676B2

(12) United States Patent
Schuette et al.

(10) Patent No.: US 10,930,676 B2
(45) Date of Patent: Feb. 23, 2021

(54) METAL OXIDE THIN FILM SEMICONDUCTOR DEVICE MONOLITHICALLY INTEGRATED WITH DISSIMILAR DEVICE ON THE SAME WAFER

(71) Applicant: Government of the United States, as represented by the Secretary of the Air Force, Wright-Patterson AFB, OH (US)

(72) Inventors: Michael L. Schuette, Kettering, OH (US); Gregg H. Jessen, Beavercreek, OH (US); Kevin D. Leedy, Dayton, OH (US); Robert C. Fitch, Jr., Xenia, OH (US); Andrew J. Green, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/722,022

(22) Filed: Dec. 20, 2019

(65) Prior Publication Data

US 2020/0135769 A1   Apr. 30, 2020

Related U.S. Application Data

(62) Division of application No. 15/906,322, filed on Feb. 27, 2018, now abandoned.

(Continued)

(51) Int. Cl.
*H01L 27/12* (2006.01)
*H01L 29/786* (2006.01)
(Continued)

(52) U.S. Cl.
CPC ...... *H01L 27/1207* (2013.01); *H01L 21/8252* (2013.01); *H01L 21/8258* (2013.01); *H01L 23/528* (2013.01); *H01L 27/0605* (2013.01); *H01L 27/085* (2013.01); *H01L 27/1225* (2013.01); *H01L 27/1251* (2013.01); *H01L 27/1259* (2013.01); *H01L 27/3248* (2013.01); *H01L 29/0649* (2013.01); *H01L 29/205* (2013.01); *H01L 29/24* (2013.01); *H01L 29/4908* (2013.01); *H01L 29/66969* (2013.01); *H01L 29/7787* (2013.01); *H01L 29/7869* (2013.01); *H01L 51/0508* (2013.01); *H01L 29/2003* (2013.01); *H01L 29/66462* (2013.01); *H01L 29/7786* (2013.01)

(58) Field of Classification Search
CPC .......... H01L 29/7869; H01L 29/78693; H01L 27/1207; H01L 27/085; H01L 27/1214; H01L 27/1215
See application file for complete search history.

(56) References Cited

U.S. PATENT DOCUMENTS

2005/0110091 A1\* 5/2005 Yamazaki ......... H01L 21/28158
257/347

\* cited by examiner

*Primary Examiner* — Thanhha S Pham
(74) *Attorney, Agent, or Firm* — AFMCLO/JAZ; Charles R. Figer, Jr.

(57) ABSTRACT

A monolithically integrated circuit comprising a semiconducting wafer, a metal oxide thin film semiconductor device disposed adjacent a first region of the semiconducting wafer, and a dissimilar semiconductor device disposed adjacent a second region of the semiconducting wafer and fabrication methods thereof.

8 Claims, 8 Drawing Sheets

Related U.S. Application Data

(60) Provisional application No. 62/465,375, filed on Mar. 1, 2017.

(51) Int. Cl.
*H01L 27/085* (2006.01)
*H01L 23/528* (2006.01)
*H01L 29/06* (2006.01)
*H01L 29/778* (2006.01)
*H01L 29/205* (2006.01)
*H01L 29/24* (2006.01)
*H01L 21/8252* (2006.01)
*H01L 27/06* (2006.01)
*H01L 29/66* (2006.01)
*H01L 21/8258* (2006.01)
*H01L 27/32* (2006.01)
*H01L 29/49* (2006.01)
*H01L 51/05* (2006.01)
*H01L 29/20* (2006.01)

METAL OXIDE THIN FILM SEMICONDUCTOR DEVICE MONOLITHICALLY INTEGRATED WITH DISSIMILAR DEVICE ON THE SAME WAFER

CROSS REFERENCE TO RELATED APPLICATION

This application is a divisional of co-pending U.S. application Ser. No. 15/906,322, filed Feb. 27, 2018, entitled "Metal Oxide Thin Film Semiconductor Device Monolithically Integrated With Dissimilar Device on the Same Wafer," which claims the benefit of and priority to U.S. Provisional Application Ser. No. 62/465,375, filed Mar. 1, 2017, entitled "Method of Monolithic Thin-Film Transistor Integration with Compound Semiconductors," the entire contents of which are incorporated herein by reference.

GOVERNMENT INTEREST

The invention described herein may be manufactured and used by or for the Government of the United States for all governmental purposes without the payment of any royalty.

FIELD OF THE INVENTION

The present disclosure relates generally to integrated circuits. More particularly, the present disclosure relates to monolithic integration of metal oxide thin film semiconducting devices, such as metal oxide thin film transistors (MOTFTs), and dissimilar semiconductor devices, such as compound semiconductor transistors, on a single wafer and associated methods of fabrication of such monolithically integrated circuits.

BACKGROUND OF THE INVENTION

Metal oxide thin film transistors (TFTs) containing post-transition metal cations such as In, Ga, Zn, and Sn have gained interest for application spaces overlapping and extending beyond that of a-Si:H TFTs because these devices have both electrical performance and manufacturability that are superior to a-Si:H. For example, flat-panel displays driven by InGaZnO (or simply IGZO) TFT switching elements have been produced commercially and feature high image refresh rates thanks to the material's high electron mobility. Further, transparent and flexible electronics have been enabled by metal oxide semiconductors' unique properties of optical transparency and low-temperature processing.

In conventional integrated circuit (IC) technology, small size, low cost, and high performance can be achieved when all circuit components/devices are monolithically integrated onto or into a single piece of crystalline semiconductor wafer. These devices include active elements (e.g., transistors) whose semiconductor material properties were established during material growth and prior to IC processing, as well as passive elements (e.g., resistors, inductors, and capacitors) and interconnects. To enable functionality of two or more semiconductor devices that cannot be formed from a common semiconducting wafer, devices formed from dissimilar semiconductor materials, such as metal oxide thin film transistors and compound semiconductors, are separately manufactured and then connected together. Regardless of whether these separately manufactured devices are packaged and then connected on a circuit board or connected more intimately as unpackaged dies, compromises in size, manufacturing complexity, and performance are made as compared to conventional IC technology where the devices are formed together in a single monolithically integrated circuit. Although monolithic integration devices composed of dissimilar semiconductor material would expand circuit design flexibility and functionality while minimizing said compromises, thermodynamic constraints have prevented the simultaneous manufacture of devices formed from dissimilar semiconductor materials.

SUMMARY OF THE INVENTION

The above and other needs are met by a monolithically integrated circuit including a semiconducting wafer, a metal oxide thin film semiconductor device disposed adjacent a first region of the semiconducting wafer, and a dissimilar semiconductor device disposed adjacent a second region of the semiconducting wafer. According to certain embodiments, the dissimilar semiconductor device is electrically isolated from the first region of the semiconducting wafer and the integrated circuit further includes an electrically conducting interconnect layer connecting the metal oxide thin film semiconductor device to the dissimilar semiconductor device.

According to certain embodiments, the dissimilar semiconductor device is a compound semiconductor transistor; the semiconducting wafer comprises an alloy of two or more of indium, gallium, aluminum, phosphorus, nitrogen, and arsenic; and/or the metal oxide thin film semiconductor device includes a metal oxide thin film semiconductor gate embedded in the semiconducting wafer. In certain embodiments, the metal oxide thin film semiconductor device includes a metal oxide thin film semiconductor device gate and a metal oxide thin film semiconductor device dielectric layer and the dissimilar semiconductor device includes a dissimilar semiconductor device gate and a dissimilar semiconductor device passivation layer. At least one of the metal oxide thin film semiconductor device gate and metal oxide thin film semiconductor device dielectric layer may be formed from a same material and concurrently with the dissimilar semiconductor device gate and the dissimilar semiconductor device passivation layer, respectively.

In accordance with another embodiment of the disclosure, a monolithically integrated circuit includes a semiconducting wafer comprising an alloy of two or more of indium, gallium, aluminum, phosphorus, nitrogen, and arsenic; a metal oxide thin film semiconductor device disposed adjacent a first region of the semiconducting wafer; a dissimilar semiconductor device disposed adjacent a second region of the semiconducting wafer, the dissimilar semiconductor device being electrically isolated from the first region of the semiconducting wafer; and an electrically conducting interconnect layer connecting the metal oxide thin film semiconductor device to the dissimilar semiconductor device.

According to certain embodiments, the metal oxide thin film semiconductor device includes a metal oxide thin film semiconductor gate embedded in the semiconducting wafer. In certain embodiments, the dissimilar semiconductor device is a compound semiconductor transistor. According to some embodiments, the metal oxide thin film semiconductor device includes a metal oxide thin film semiconductor device gate and a metal oxide thin film semiconductor device dielectric layer and the dissimilar semiconductor device includes a dissimilar semiconductor device gate and a dissimilar semiconductor device passivation layer. At least one of the metal oxide thin film semiconductor device gate and metal oxide thin film semiconductor device dielectric layer may be formed from a same material and concurrently with the dissimilar semiconductor device gate and the dissimilar semiconductor device passivation layer, respectively.

According to yet another embodiment of the disclosure, a method of forming a monolithically integrated circuit on a semiconducting wafer includes forming a metal oxide thin film semiconductor device adjacent a first region of the semiconducting wafer and forming a dissimilar semiconductor device on a second region of the semiconducting wafer. According to certain embodiments, the dissimilar semiconductor device includes a thermal budget and the metal oxide thin film semiconductor device is formed in processing conditions that do not exceed the thermal budget of the dissimilar semiconductor device. According to certain embodiments, the method further includes forming electrically conducting interconnects between the metal oxide thin film semiconductor device and the dissimilar semiconductor device.

According to certain embodiments, the metal oxide thin film semiconductor device and dissimilar semiconductor device are formed concurrently in a front end of line process. According to certain embodiments, the front end of line process includes depositing one or more insulating layers adjacent the dissimilar semiconductor device gate for passivation of the dissimilar semiconductor device prior to forming at least some layers of the metal oxide thin film semiconductor device. According to some embodiments, the one or more insulating layers is deposited concurrently adjacent the first region of the semiconducting wafer for forming a dielectric film for the metal oxide thin film semiconductor device. In certain embodiments, the metal oxide thin film semiconductor device includes a metal oxide thin film semiconductor device gate and the dissimilar semiconductor device includes a dissimilar semiconductor device gate, and the metal oxide thin film semiconductor device gate may be formed from a same material and concurrently with the dissimilar semiconductor device gate.

According to certain embodiments, the front end of line process may also include forming a metal oxide thin film semiconductor device gate adjacent the first region of the semiconducting wafer and a dissimilar semiconductor device gate adjacent the second region of the semiconducting wafer; depositing a metal oxide thin film semiconductor device insulating layer adjacent the metal oxide thin film semiconductor device gate and over the dissimilar semiconductor device gate; depositing a metal oxide thin film semiconductor device semiconducting layer adjacent the metal oxide thin film semiconductor device insulating layer; and removing the metal oxide thin film semiconductor device insulating layer and the metal oxide thin film semiconductor device semiconducting layer from the second region of the semiconducting wafer. In some embodiments, the method further includes depositing a protective layer over the dissimilar semiconductor device gate prior to depositing the metal oxide thin film semiconductor device semiconducting layer.

In other embodiments, the dissimilar semiconductor device is formed prior to forming the metal oxide thin film semiconductor device in a back end of line process. According to the embodiment, the method may include forming a dissimilar semiconductor device gate adjacent the second region of the semiconducting wafer; depositing one or more insulating layers and one or more electrically conducting interconnect layers over the dissimilar semiconductor device gate and the first region of the semiconducting wafer; forming the metal oxide thin film semiconductor device; and forming electrically conducting interconnects between the metal oxide thin film semiconductor device and the dissimilar semiconductor device to connect the metal oxide thin film semiconductor device to the dissimilar semiconductor device. In certain embodiments, the metal oxide thin film semiconductor device is formed on top of the one or more insulating layers.

BRIEF DESCRIPTION OF THE DRAWINGS

Other embodiments of the disclosure will become apparent by reference to the detailed description in conjunction with the figures, wherein elements are not to scale so as to more clearly show the details, wherein like reference numbers indicate like elements throughout the several views, and wherein.

DETAILED DESCRIPTION OF THE INVENTION

Figure 1:
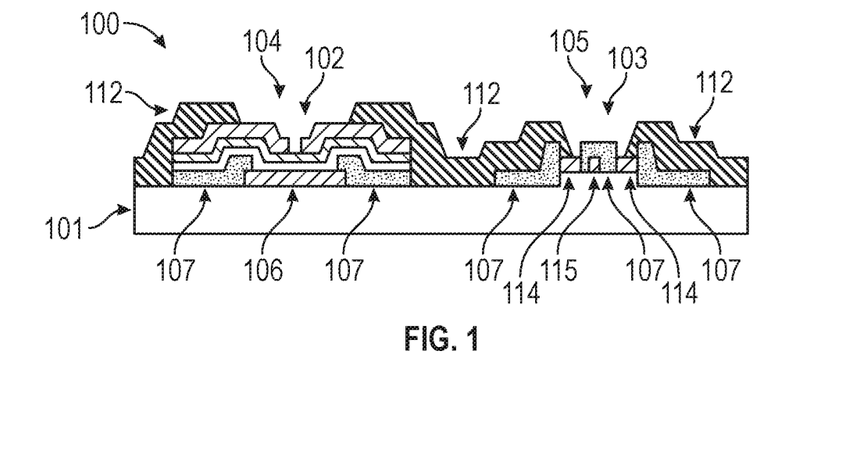
FIG. 1 depicts a cross-sectional view of a monolithically integrated circuit having a metal oxide thin film semiconductor device and a dissimilar semiconductor device on the same semiconducting wafer according to one embodiment of the disclosure.

Referring to the exemplary embodiment of FIG. 1, the present disclosure provides a monolithically integrated circuit 100 having a metal oxide thin film semiconductor device 102 and a dissimilar semiconductor device 103 monolithically integrated on the same semiconducting wafer 101. For purposes of the present disclosure, a "monolithically integrated circuit" refers to a circuit comprising at least two devices that are fabricated together onto a common wafer 101. In contrast, a "heterogeneously integrated circuit" would be a circuit where two devices are independently fabricated and then one of the devices is transferred onto the wafer of the first device or both devices are transferred to a common wafer. As shown, according to the monolithically integrated circuit 100 of the present disclosure, the metal oxide thin film semiconductor device 102 is preferably disposed adjacent a first region 104 of the wafer 101 while the dissimilar device 103 is preferably disposed adjacent a second region 105 of the wafer 101. In preferred embodiments, the dissimilar semiconductor device 103 is electrically isolated from the first region 104 of the wafer 101, as explained further below, with the exception of an electrically conducting interconnect layer 112 connecting the metal oxide thin film semiconductor device 102 to the dissimilar semiconductor device 103.

For purposes of the present disclosure, the metal oxide thin film semiconductor device 102 is preferably a metal oxide thin film transistor (MOTFT). However, it should be understood the metal oxide thin film semiconductor device 102 of the monolithically integrated circuit 100 may also include non-transistor (i.e., two-terminal) variants such as metal oxide thin film diodes and varactors using the fabrication methods described herein.

For purposes of the present disclosure, the dissimilar semiconductor device 103 is preferably a dissimilar active semiconductor device such as a compound semiconductor (CS) transistor. In certain embodiments, the dissimilar active semiconductor device is made from elemental semiconductors in group IV of the periodic table. However, it should be understood that the dissimilar semiconductor device 103 of the monolithically integrated circuit 100 may be of either an elemental semiconductor type or a compound semiconductor type. The dissimilar semiconductor device 103 may also be any number of device types, including, by way of example, and not as a limitation, a Schottky-gate field-effect transistor (FET), metal oxide field effect transistor (MOSFET), bipolar transistor, light emitting diode (LED), light detector, Schottky diode, and other transistor, diode, varactor, emitter, sensor devices. In short, the dissimilar semiconductor device 103 is "dissimilar" to the metal oxide thin film semiconductor device 102 because the semiconducting region of device 103 is fabricated from the material of the wafer 101 instead of through deposition of one or more semiconducting layers on top of a substrate as required in forming the metal oxide thin film semiconductor device 102.

According to preferred embodiments of the disclosure, the semiconducting wafer 101 is formed of an alloy comprising two or more of indium, gallium, aluminum, phosphorous, nitrogen, and arsenic such as binaries GaAs, AlAs, GaN, AlN, InP, and AlP, or ternaries InGaAs, AlGaAs, InGaN, AlGaN, InAlP. However, wafer 101 may be formed from countless other semiconducting materials as known in the art and within the spirit of the present disclosure. Further, a wafer 101 with one or more epitaxial layers (i.e., an epitaxial wafer) on top of the wafer surface is still considered a wafer 101 for the purposes of the present disclosure.

The first region 104 of the wafer 101 is defined broadly as the general area in which the metal oxide thin film semiconductor device 102 is formed/resides (i.e., the thin film device 102 is disposed adjacent to the first region 104 of the wafer) as compared to the second region 105 of the wafer 101 in which the dissimilar semiconductor device 103 is formed/resides. In certain embodiments, the metal oxide thin film semiconductor device 102 is formed directly on the first region 104 (such as in an etched/isolated region of the wafer 101 in a front end of line process described below). In other embodiments, the metal oxide thin film semiconductor device 102 is considered to be disposed adjacent the first region 104 when several intervening layers are disposed between the wafer 101 and the metal oxide thin film semiconductor device 102 (such as when the thin film device 102 is formed on top of intervening dielectric layers in a back end of line process described below). Similarly, the dissimilar semiconductor device 103 is considered to be disposed adjacent the second region 105 of wafer 101 whether the dissimilar device 103 is formed directly on the second region 105 or on top of one or more intervening epitaxial layers.

Figure 2:
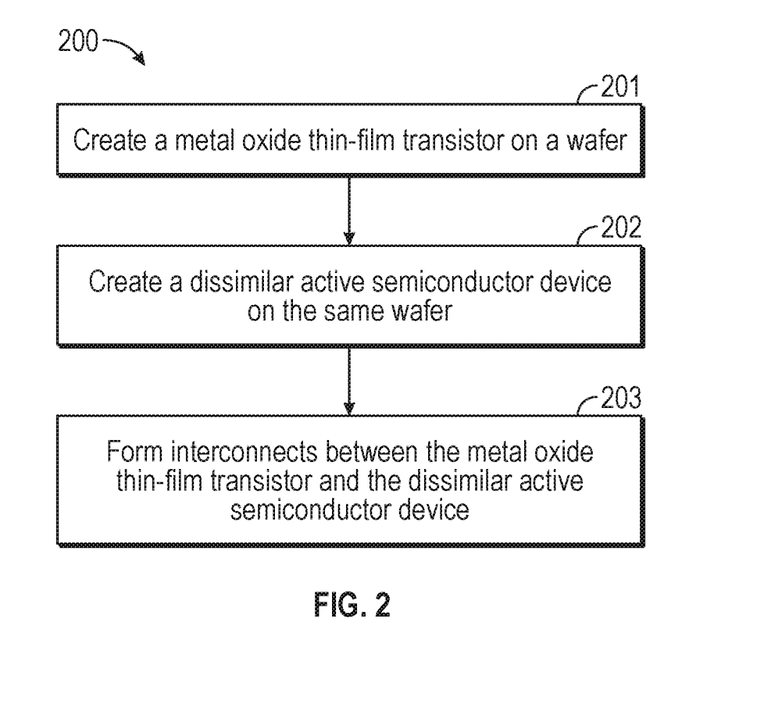
FIG. 2 is a flowchart of a general process of fabricating a monolithically integrated circuit having a metal oxide thin film semiconductor device and a dissimilar semiconductor device on the same semiconducting wafer according to one embodiment of the present disclosure.

Referring to FIG. 2, the general process of monolithically integrating a metal oxide thin film semiconductor device 102 onto the same semiconducting wafer 101 with a dissimilar semiconductor device 103 is shown. In step 201 and step 202, the metal oxide thin film semiconductor device 102 and dissimilar semiconductor device 103 are formed adjacent respective regions 104, 105 of the same semiconducting wafer 101. According to certain embodiments, process 200 includes forming the dissimilar semiconductor device 103 (step 202 of FIG. 2) prior to forming the metal oxide thin film semiconductor device 102 (step 201 of FIG. 2) in a back end of line (BEOL) process. When a BEOL process is used, one or more dielectric insulating layers are deposited over the dissimilar semiconductor device 103 so that the dissimilar semiconductor device 103 is protected from the processing conditions required to form the various layers of the metal oxide thin film semiconductor device 102. The metal oxide thin film semiconductor device 102 is preferably formed on top of the one or more dielectric insulating layers. In alternate embodiments, the metal oxide thin film semiconductor device 102 is formed within a plurality of dielectric insulating layers.

Figure 3:
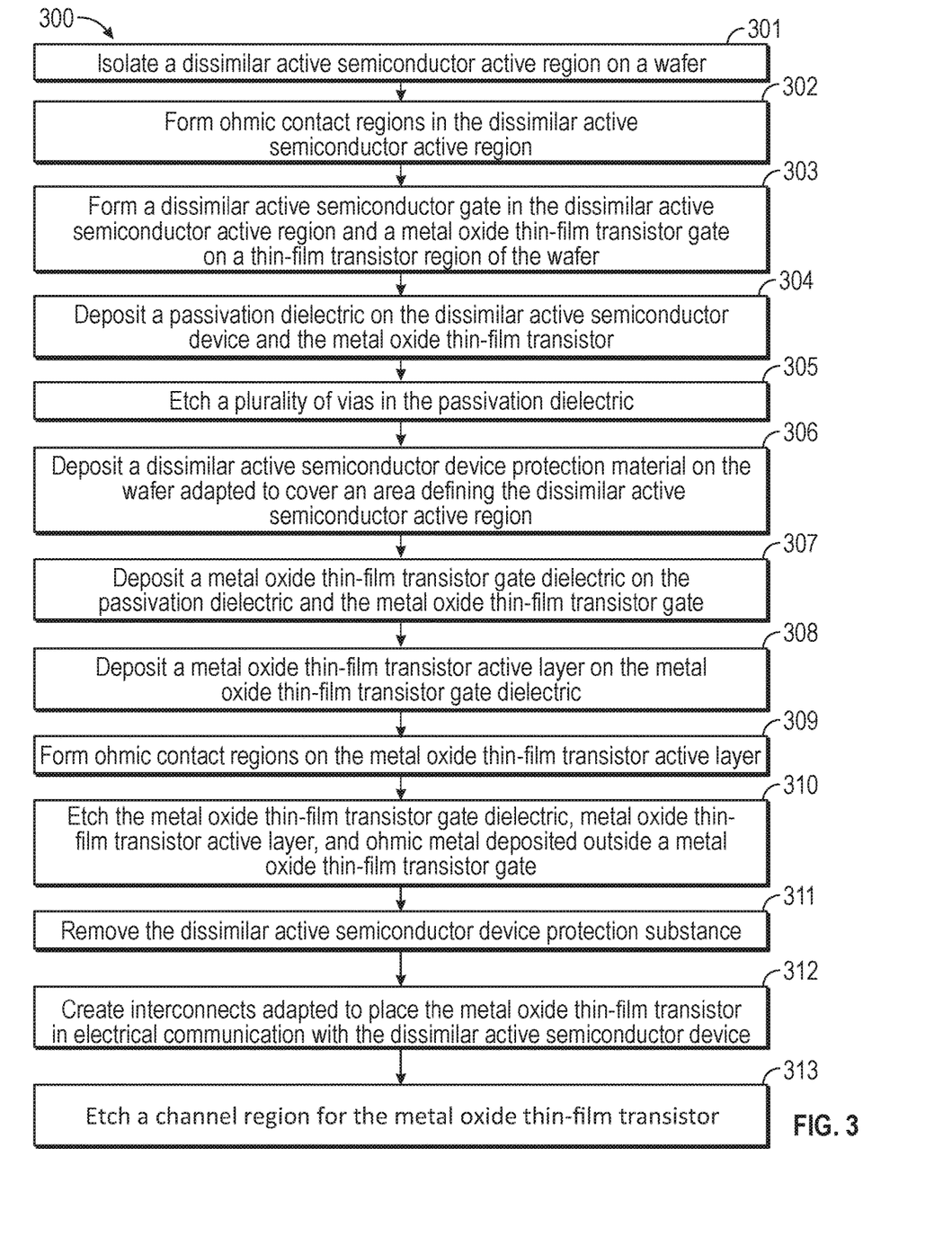
FIG. 3 is a flowchart of an exemplary front end of line process of fabricating a monolithically integrated circuit having a metal oxide thin film semiconductor device and a dissimilar semiconductor device on the same semiconducting wafer according to one embodiment of the present disclosure.

According to other embodiments of the disclosure, devices 102 and 103 may be formed concurrently during steps 301 and 302 of FIG. 3 in a front end of line process (FEOL). For purposes of the present disclosure, the metal oxide thin film semiconductor device 102 is "formed concurrently" with the dissimilar semiconductor device 103 when certain layers of the metal oxide thin film semiconductor device 102 are formed prior to the dissimilar semiconductor device 103 being completed. When a FEOL process is used, the devices 102 and 103 preferably share certain layers for more efficient processing of the devices. For example, referring back to the monolithically integrated circuit 100 of FIG. 1, the metal oxide thin film semiconductor device 102 includes a metal oxide thin film semiconductor device gate 106 and corresponding metal oxide thin film semiconductor device gate dielectric/insulating layer 107 deposited adjacent the first region 104 of wafer 101. The dissimilar semiconductor device 103 includes a dissimilar semiconductor device gate 115 that may be formed from the same material and concurrently with the metal oxide thin film semiconductor device gate 106 (i.e., during the same process step and under similar processing conditions). Similarly, the dielectric/insulating layer 107 of the metal oxide thin film semiconductor device 102 may be used as the passivation layer 107 for the dissimilar semiconductor device 103.

Whether the process 200 of forming both the metal oxide thin film semiconductor device 102 and dissimilar semiconductor device 103 uses a BEOL process, a FEOL process, or a combination of both BEOL and FEOL processes, step 203 of FIG. 2 provides forming electrically conducting interconnects between the metal oxide thin film semiconductor device 102 and dissimilar semiconductor device 103 to connect the dissimilar semiconductor device 103 to the metal oxide thin film semiconductor device 102 on the same semiconducting wafer 101. In typical BEOL embodiments, step 203 includes forming multiple levels of dielectric/insulating layers and interconnects (e.g., vertical metal vias) to connect the dissimilar semiconductor device 103 to the metal oxide thin film semiconductor device 102, and at least some of the interconnects are formed prior to forming the metal oxide thin film semiconductor device 102. As explained in more detail below, in typical FEOL embodiments, step 203 includes, at least in part, depositing an interconnect layer on top of both a portion of the metal oxide thin film semiconductor device 102 and dissimilar semiconductor device 103.

Referring to FIGS. 3-14, a more detailed FEOL process 300 for forming a monolithically integrated circuit 100 such as shown in FIG. 1 is shown according to one exemplary embodiment of the disclosure. It should be understood that the various steps of this process can vary, be performed in a different order, certain steps can be omitted, etc. For example, according to the embodiment shown in FIGS. 3-14, the metal oxide thin film semiconductor device 102 may be configured in a reverse staggered metal oxide configuration with gate 106 on bottom and ohmic contacts 114 on top. However, in other embodiments, the gate 106 may be formed on top of the metal oxide thin film semiconductor device 102 or in a coplanar configuration with other layers. As noted above, according to preferred embodiments, features or elements common to the metal oxide thin film semiconductor device 102 and dissimilar semiconductor device 103 are preferably formed concurrently and of the same material when possible.

Figure 4:
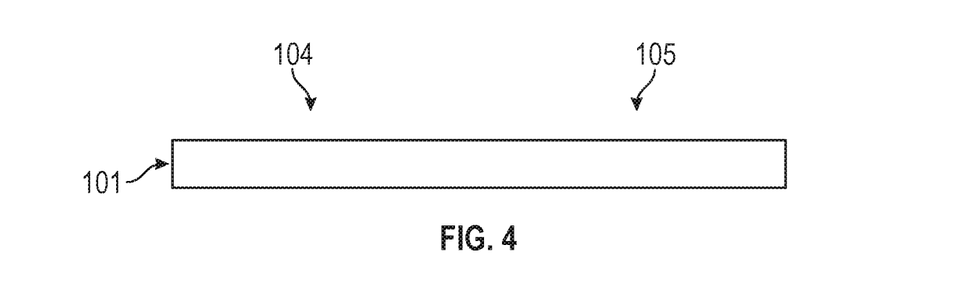
FIGS. 4-14 depict cross-sectional views of the monolithically integrated circuit as it is being fabricated according to the process of FIG. 3.
Figure 5:
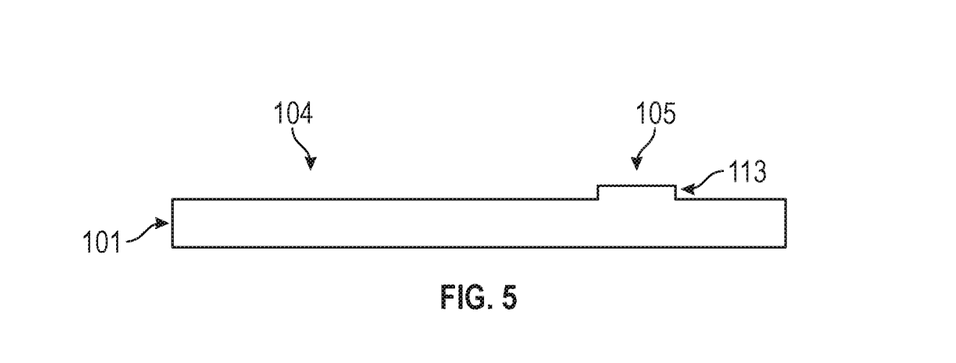

Referring to FIGS. 3-5, step 301 of exemplary process 300 includes electrically isolating the second region 105 of the wafer 101 from the first region 104 (i.e., electrically isolating the second region 105 on the wafer used for forming a dissimilar semiconductor device 103 from the first region 104 used for forming the metal oxide thin film semiconductor device 102). For purposes of the present disclosure, "electrically isolating" or "electrically isolated" refers to the first region 104 of wafer 101 (and accompanying metal oxide thin film semiconductor device 102 disposed adjacent the first region 104) and the second region 105 (and accompanying dissimilar semiconductor device 103) being electrically insulated from each other with the exception of electrically conducting interconnects/interconnect layers 112 connecting the metal oxide thin film semiconductor device 102 to the dissimilar semiconductor device 103.

According to certain embodiments, the second region 105 is electrically isolated by removing (e.g., etching) any semiconducting films at the location of, or surrounding, the first region 104 (as depicted in FIG. 5 with a dissimilar semiconductor device epitaxial layer 113 raised with respect to isolated first region 104); using an ion implantation step to make the first region insulating; and/or depositing a dielectric/insulating film on top of the first region 104 of wafer 101 before forming the metal oxide thin film semiconductor device 102 on top of the dielectric/insulating film. It is noted that gate geometries may be defined in the dissimilar semiconductor isolation step 301 where a dissimilar semiconductor epitaxial barrier layer (not depicted in the figures) may serve as a metal oxide thin film insulating layer and a buried conducting layer may serve as the metal oxide thin film semiconductor device gate 106.

Figure 6:
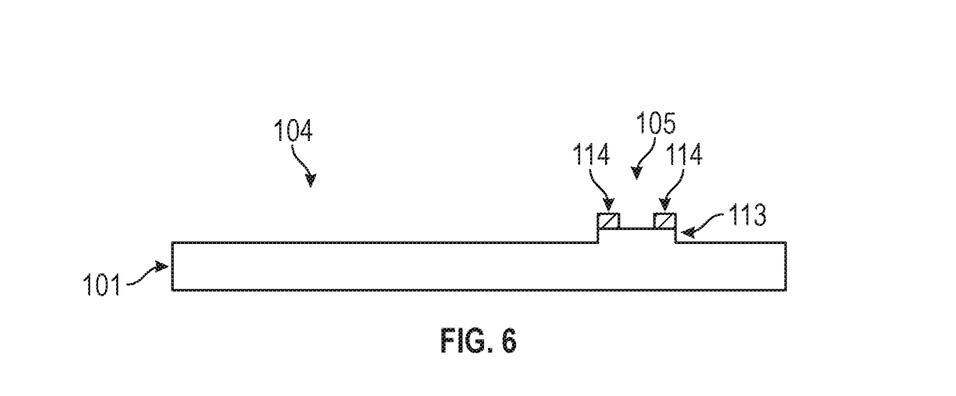

Referring to FIGS. 3 and 6, step 302 of exemplary process 300 includes depositing ohmic contacts 114 on the second region 105 of wafer 101. It should be understood that ohmic contacts 114 may be "deposited" by a variety of known microelectronic techniques used to (1) apply or form conductive material such as electron-beam deposition, sputter deposition, atomic layer deposition (ALD), chemical vapor deposition (CVD), electroplating, pulsed laser deposition (PLD), ion implanting, CVD, and other chemical methods used to make the material more conductive; and (2) define the geometries within which the conductive material resides such as resist-based lithography (photo, e-beam, x-ray, etc.) combined with liftoff or etching by wet chemicals or reactive ions in the regions outside the ohmic contact geometries. The semiconducting and insulating layers described below are more likely to be formed by PLD, CVD, ALD, sputtering, and solution processing. For purposes of the present disclosure, the terms "deposited," depositing," "formed," and/or "forming" are intended to collectively encompass known microelectronic techniques such as those identified above.

Figure 7:
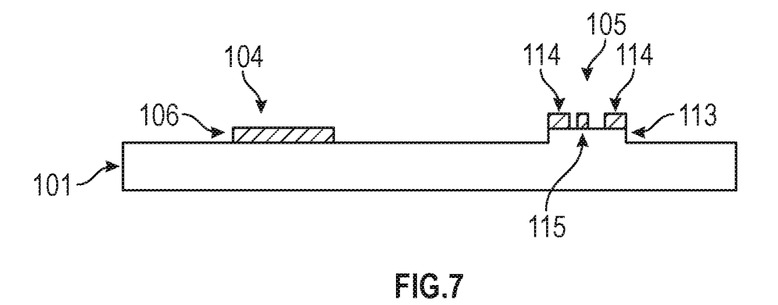
Figure 8:
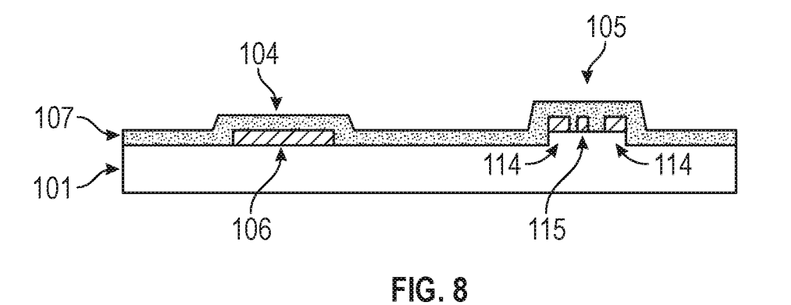

Referring to FIGS. 3 and 7, step 303 of the exemplary process 300 includes forming a metal oxide thin film semiconductor device gate 106 (e.g., transistor) adjacent the first region 104 and a dissimilar semiconductor device gate 115 adjacent the second region 105. Continuing to FIG. 8, step 304 of exemplary process 300 includes depositing a passivation dielectric 107 on the metal oxide thin film transistor gate 106 of the first region 104 and on the dissimilar semiconductor device gate 115 and ohmic contacts 114 of the second region 105. As illustrated in FIGS. 7-8, the gate 106 and/or passivation dielectric layer 107 of the metal oxide thin film semiconductor device 102 may be formed of the same material and concurrently with the gate 106 and/or passivation dielectric layer 107 of the dissimilar semiconductor device 103, respectively. In other words, with respect to the passivation dielectric layer 107, it serves as a passivation layer for the dissimilar semiconductor device 103 and a field dielectric for the metal oxide thin film semiconductor device 102. In an alternate embodiment, gate 106 of the metal oxide thin film semiconductor device 102 is formed from the semiconducting wafer 101.

Figure 9:
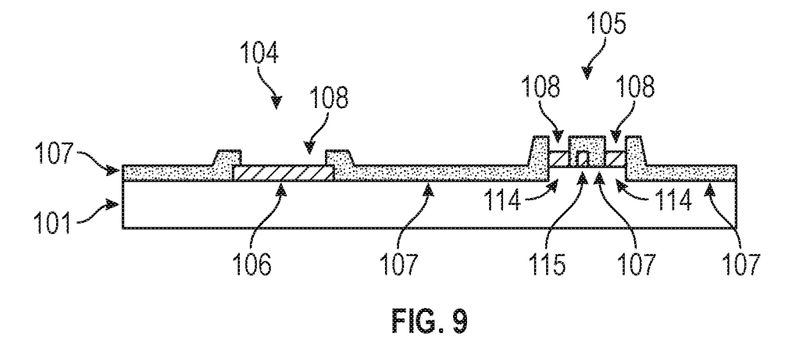
Figure 10:
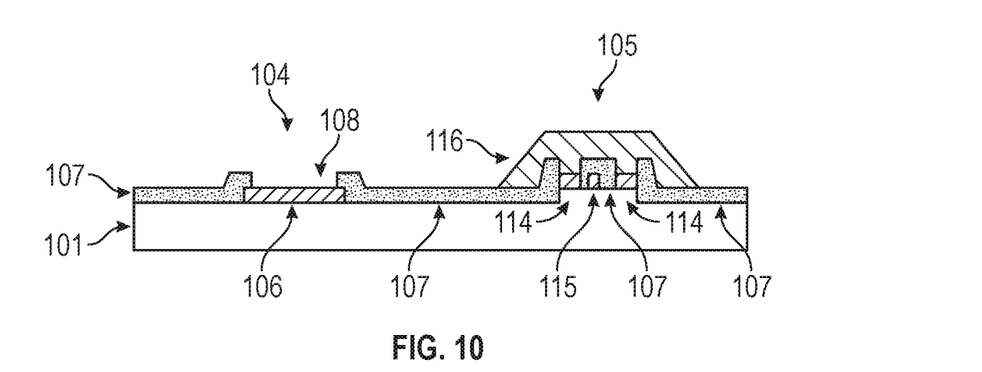

Referring to FIGS. 3 and 9, step 305 of the exemplary process 300 includes etching a plurality of vias 108 in the passivation dielectric layer 107 adjacent both the metal oxide thin film transistor gate 106 of the first region 104 and adjacent the dissimilar semiconductor gate 115/ohmic contacts 114 of the second region 105.

After forming the dissimilar semiconductor device ohmic contacts 114, gate 115, depositing passivation layer 107, and etching vias 108 in the second region 105, the dissimilar semiconductor device 103 is substantially formed. However, fabrication of the metal oxide thin film semiconductor device 102 must be completed without compromising the already formed components of the dissimilar semiconductor device 103 disposed on the same wafer 101. Accordingly, the following steps of process 300 must be performed in processing conditions that do not exceed the thermal budget of the dissimilar semiconductor device 103, which is typically in the range of 150 to 400° C. for preferred semiconducting wafers 101 of the present disclosure such as GaAs, InP, and GaN based devices. Further, thin film process steps such as film depositions and etching should avoid altering the properties of sensitive regions of the dissimilar semiconductor device 103 (e.g., sensitive regions generally being areas between the gate 115 and ohmic contacts 114). Thus, referring to FIGS. 3 and 10, step 306 of exemplary process 300 preferably includes the step of depositing a dissimilar semiconductor device protective layer 116 over the dissimilar semiconductor device 103. The protective layer 116 further isolates/insulates the dissimilar semiconductor device 103 from the first region 104 of wafer 101 and the processing conditions necessary to finish forming the metal oxide thin film semiconductor device 102 described below.

Figure 11:
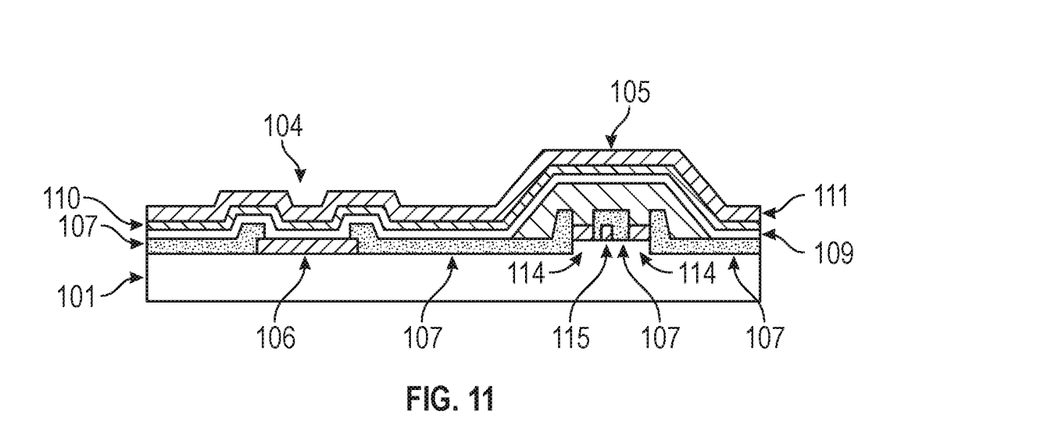

Referring to FIGS. 3 and 11, steps 307-309 of exemplary process 300 form the metal oxide thin film semiconductor device 102 by depositing a metal oxide thin film semiconductor device dielectric/insulating layer 109, a metal oxide thin film semiconductor device active/semiconducting layer 110, and a metal oxide thin film semiconductor device ohmic layer 111 adjacent the metal oxide thin film semiconductor device gate 106 and passivation dielectric layer 107. In preferred embodiments, the metal oxide thin film insulating layers 109 is an insulator such as, but not limited to, $SiO_2$, $Al_2O_3$, $HfO_2$, $ZrO_2$, SiN, or the like. The metal oxide thin film semiconductor device semiconducting layer 110 is preferably a metal oxide semiconducting material, such as, but not limited to, those based on Zn, In, Ga, Sn, or the like.

As noted above, the layers of the metal oxide thin film semiconductor device 102 can be deposited in varying orders as known in the art. Accordingly, the varying layers and components of the metal oxide thin film semiconductor device 102 are often referred to herein as being "adjacent" to other layers. For purposes of the present disclosure, referring to certain layer/components of the metal oxide thin film semiconductor device 102 as "adjacent" (or being "deposited adjacent") to other layers/components should be understood as meaning the particular layers are part of the metal oxide thin film semiconductor device 102 but not necessarily on top of or directly contacting the preceding layer/component. For example, insulating layer 109 may be referred to herein as adjacent the metal oxide thin film semiconductor gate 106. As depicted in FIG. 11, the insulating layer 109 is directly above gate 106, which is disposed at the bottom of the metal oxide thin film semiconductor device 102. However, as noted above, gate 106 can also be disposed on top of the metal oxide thin film semiconductor device 102. Accordingly, the insulating layer 109 is referred to as being adjacent the metal oxide thin film semiconductor device gate 106 to denote the fact that the insulating layer 109 and gate 106 are adjacent to each other by virtue of the fact that they are both layers/components of the metal oxide thin film semiconductor device 102 at the first region 104 of the wafer 101. Similarly, for purposes of the present disclosure, one layer/component being "over" another layer requires the layer to be above the other layer but not necessarily in direct contact (e.g., the metal oxide semiconductor device insulating layer 109 being deposited "over" the dissimilar semiconductor gate 115 allows for intervening layers disposed between the gate 115 and the metal oxide semiconductor device insulating layer 109).

As depicted in FIG. 11, the metal oxide thin film semiconductor device dielectric/insulating layer 109, metal oxide thin film semiconductor device active/semiconducting layer 110, and/or metal oxide thin film semiconductor device ohmic layer 111 (or gate layer if gate 106 is on top instead of on the bottom of the metal oxide thin film semiconductor device 102) may be deposited over the dissimilar semiconductor device protective layer 116 when forming the metal oxide thin film semiconductor device to simplify fabrication.

Figure 12:
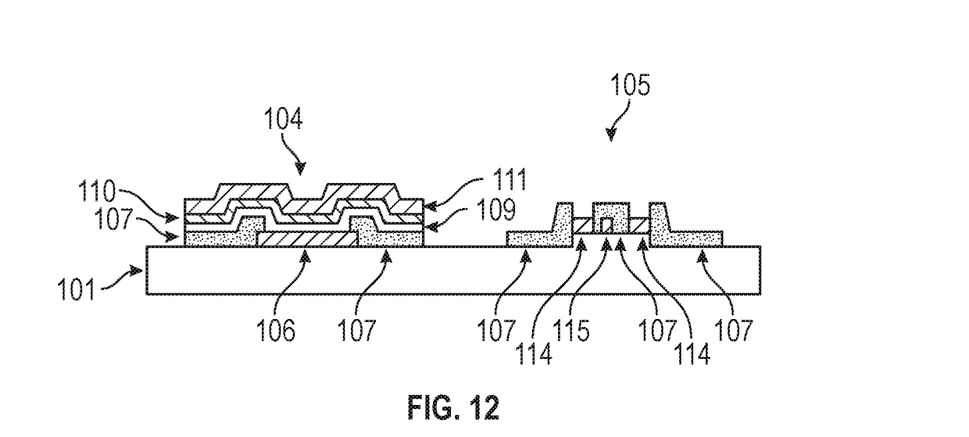

Referring to FIGS. 3 and 12, step 310 and 311 of exemplary process 300 includes removing (e.g., etching) the metal oxide thin film semiconductor insulating layer 109, metal oxide thin film semiconductor device semiconducting layer 110, metal oxide thin film semiconductor device ohmic layer 111, and/or dissimilar semiconductor device protective layer 116 from the second region 105 of the wafer 101 (i.e., the layers are removed from the dissimilar semiconductor device 103). Further, while not necessarily required, the passivation dielectric layer 107 may be removed from areas between first region 104 and second region 105 as depicted in FIG. 12 to improve device isolation described above with respect to step 301, particularly in the specific embodiment of MOTFT integration with GaN HEMT as described below.

Removal of each layer in steps 310 and 311 may be done independently of each other, or each of the layers may be removed in a single step.

Figure 13:
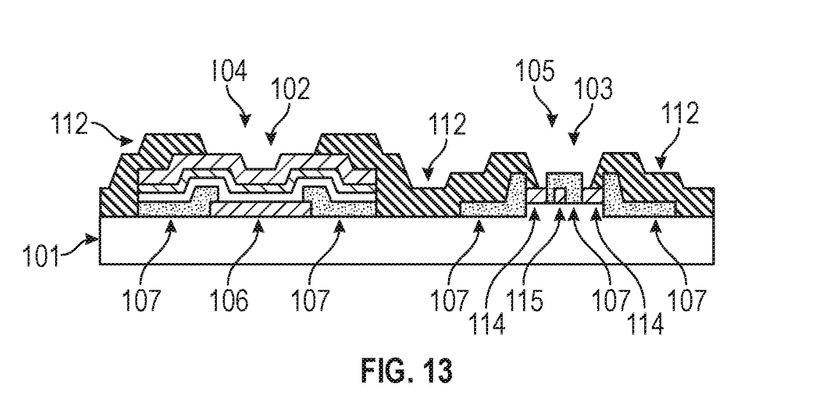

Referring to FIGS. 3 and 13, step 312 of exemplary process 300 includes forming interconnects 112 (also referred to herein as depositing an interconnect layer 112) to electrically connect one or more conducting layers of the metal oxide thin film semiconductor device 102 to the dissimilar semiconductor device 103. As shown in FIG. 13, the interconnect layer 112 connects the ohmic layer 111 of the metal oxide thin film semiconductor device 102 to the ohmic contacts 114 of the dissimilar semiconductor device 103. According to an alternate embodiment, the interconnects 112 may take the place of the ohmic layer 111 of the metal oxide thin film semiconductor device 102.

Figure 14:
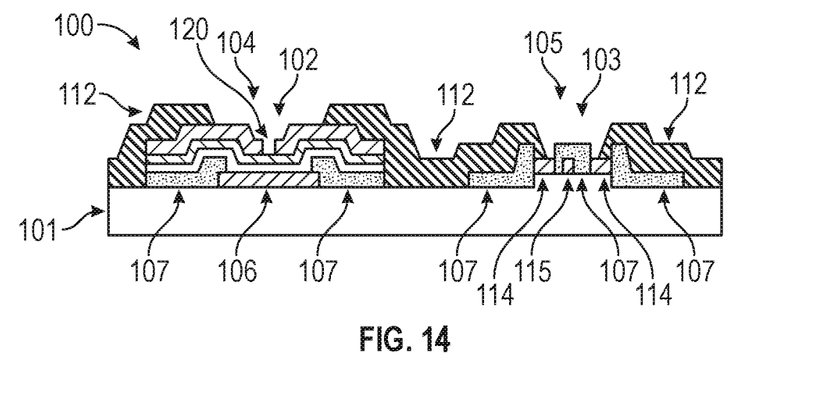

Referring to FIGS. 3 and 14, step 313 of exemplary process 300 includes etching a channel region 120 for the metal oxide thin film semiconductor device 102. The channel 120 is preferably etched after the interconnects 112 are formed so as to minimize exposure of the surface of the metal oxide thin film semiconductor device 102 to subsequent processing steps. Finally, according to preferred embodiments but not specifically depicted in the drawings, the metal oxide thin film semiconductor device 102 is further encapsulated with a dielectric film to help reduce environmental instability during operation.

In summary, according to certain embodiments of the disclosure, a metal oxide thin film semiconductor device 102 may be formed concurrently with a dissimilar semiconductor device 103 in a front end of line (FEOL) process or within or a back end of line (BEOL) process. The BEOL process does not require modification of the dissimilar semiconductor device 103 fabrication process and, thus, may be desirable in cases where the dissimilar device process cannot be altered. One particular FEOL process is described in detail herein where the metal oxide thin film semiconductor device 102 fabrication steps of gate formation, dielectric deposition, metal oxide semiconductor deposition, and/or ohmic contact formation may be inserted into the dissimilar semiconductor device 103 fabrication process. To reduce added complexity and cost, some of the baseline semiconductor FEOL process steps may be used concurrently to build metal oxide thin film transistors, and this concurrency may, but need not necessarily, involve modification of the baseline steps. For example, and without limitation, in a GaN high electron mobility transistor semiconductor process, the high electron mobility gate metal (e.g., gate 115 of FIG. 7), SiN passivation (e.g., passivation dielectric layer 107 of FIG. 8), and interconnect metal (e.g., interconnect layer 112 of FIG. 13) may double as metal oxide thin film transistor gate metal (e.g., gate 106 of FIG. 7), field dielectric (e.g., passivation dielectric layer 107 of FIG. 8), and ohmic contact metal (e.g., ohmic layer 111 of FIG. 11 is omitted and interconnect layer 112 serves as the ohmic contact metal oxide thin film transistor), respectively.

Embodiments of the monolithically integrated circuit of the present disclosure offer numerous benefits and features that may not be readily available in conventional components and devices fabricated or assembled using techniques known in the art. The switching frequency of an electronic switch, for example, may be greatly improved according to the disclosed embodiments. To illustrate, it will be appreciated that conventional cascode GaN power switches typically include at least two integrated circuits—a D-mode GaN high electron mobility transistor die and an E-mode Si nMOS die. In such a configuration, the switching frequency of the resulting power switch may be limited by capacitance in the Si nMOS, which scales with the size of the device, and inductance associated with interconnecting wire bonds as described above. Using embodiments of the present disclosure as disclosed herein, these shortcomings can be overcome.

Figure 15:
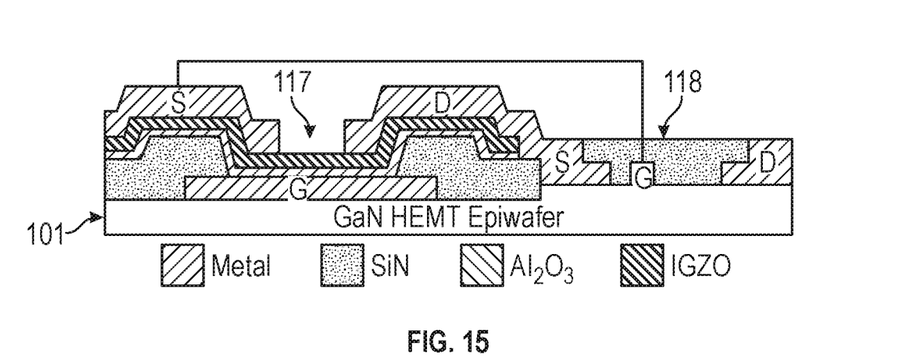
FIG. 15 is a cross-sectional view of a monolithically integrated circuit having a metal oxide thin film semiconductor device and a dissimilar semiconductor device in a cascade configuration on the same semiconducting wafer according to another embodiment of the disclosure.

More specifically, as depicted in FIG. 15, a high performance thin film transistor 117 (i.e., a metal oxide thin film semiconductor device) with very high current density and good radio frequency performance may be interdigitated on wafer 101 with a cascoded GaN high electron mobility transistor 118 (i.e., a dissimilar semiconductor device) according to the present disclosure. By replacing the E-mode Si nMOS circuit in a conventional device with high performance thin film transistor 117, capacitance in the device may be reduced due to the reduction in size of thin film transistor 117. Moreover, inductance associated with interconnecting wire bonds may be entirely or substantially eliminated as a result of the monolithic integration of the two transistors on GaN HEMT epiwafer 101.

Figure 16:
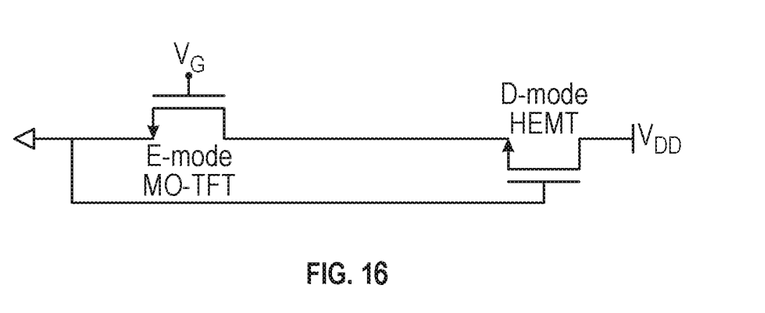
FIG. 16 is a circuit schematic of the monolithically integrated circuit depicted in FIG. 15.
Figure 17:
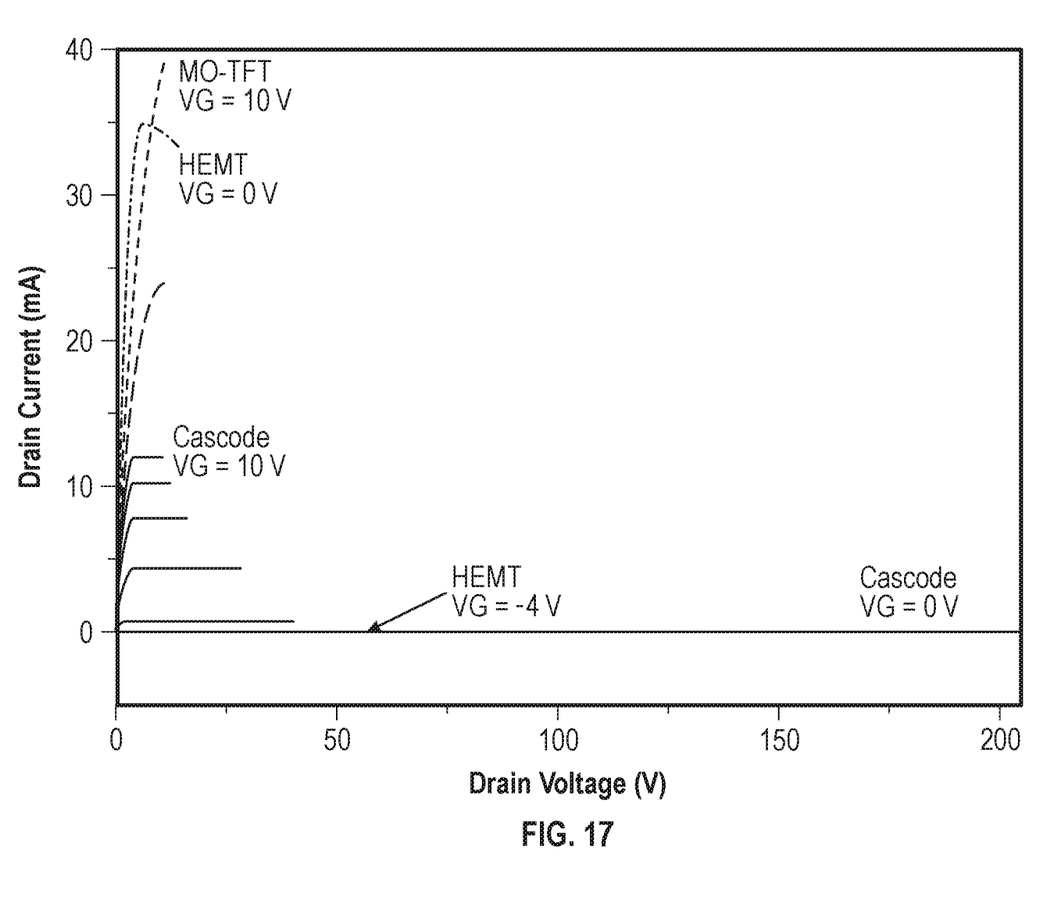
FIG. 17 is a graph of I-V curves for the monolithically integrated circuit depicted in FIG. 15.

The D-mode GaN high electron mobility transistor 118 may be operated as E-mode when connected in cascode with the E-mode transistor 117. Resulting I-V curves for D-mode transistor 118 and the E-mode transistor 117 connected by interconnects in cascode combination are depicted in FIG. 17. Referring additionally to the corresponding circuit schematic depicted in FIG. 16, the >200 V breakdown characteristic of the D-mode GaN high electron mobility transistor switch 118 is combined with the gate driving characteristic of the E-mode transistor 117. This combination effectively shifts the D-mode GaN high electron mobility transistor 118 threshold voltage from −3 V to +1 V. A field dielectric may be used to minimize parasitic thin film transistor capacitance and thus offer performance advantages. According to preferred embodiments, as noted above, the passivation dielectric layer 107 is deposited as a single layer where the dielectric 107 serves as electrical passivation for the semiconductor transistor and as a field dielectric for the thin film transistor as exemplified in FIG. 8.

Embodiments of the present disclosure with the metal oxide thin film semiconductor device 102 monolithically integrated on the same wafer 101 with a dissimilar semiconductor device 103 include increased current density without increasing the capacitance of the integrated circuit, faster switching characteristics, improved thermal performance, and an overall simpler package with improved performance when compared to conventional devices, such as a silicon MOSFET driven cascoded GaN high electron mobility transistor. In view of these and other advantages, embodiments of the monolithically integrated circuit of the present disclosure can be used for a variety of applications, including direct-coupled field effect transistor logic involving D-mode compound semiconductor transistors and E-mode metal oxide thin film transistors, RF circuits with metal oxide thin film transistor switches, monolithic photodetector readout integrated circuits, low-power analog circuits, and drain voltage switching for high efficiency RF power amplifiers.

The foregoing description of preferred embodiments for this disclosure have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. A method of forming a monolithically integrated circuit on a semiconducting wafer, the method comprising:
   forming a metal oxide thin film semiconductor device adjacent a first region of the semiconducting wafer; and
   forming a dissimilar semiconductor device on a second region of the semiconducting wafer,
   wherein forming the metal oxide thin film semiconductor device and dissimilar semiconductor device includes:
      forming a metal oxide thin film semiconductor device gate adjacent the first region of the semiconducting wafer and a dissimilar semiconductor device gate adjacent the second region of the semiconducting wafer;
      depositing a metal oxide thin film semiconductor device insulating layer adjacent the metal oxide thin film semiconductor device gate and over the dissimilar semiconductor device gate;
      depositing a metal oxide thin film semiconductor device semiconducting layer adjacent the metal oxide thin film semiconductor device insulating layer; and
      removing at least a portion of the metal oxide thin film semiconductor device insulating layer and the metal oxide thin film semiconductor device semiconducting layer from the second region of the semiconducting wafer.

2. The method of claim 1 wherein the dissimilar semiconductor device includes a thermal budget and the metal oxide thin film semiconductor device is formed in processing conditions that do not exceed the thermal budget of the dissimilar semiconductor device.

3. The method of claim 1 wherein the metal oxide thin film semiconductor device and dissimilar semiconductor device are formed concurrently in a front end of line process.

4. The method of claim 3 further comprising depositing one or more insulating layers adjacent the dissimilar semiconductor device gate for passivation of the dissimilar semiconductor device prior to forming at least some layers of the metal oxide thin film semiconductor device.

5. The method of claim 4 wherein at least one of the one or more insulating layers is deposited adjacent the first region of the semiconducting wafer for forming a dielectric film for the metal oxide thin film semiconductor device concurrently with being deposited adjacent the dissimilar semiconductor device gate.

6. The method of claim 3 wherein the metal oxide thin film semiconductor device includes a metal oxide thin film semiconductor device gate and the dissimilar semiconductor device includes a dissimilar semiconductor device gate, the metal oxide thin film semiconductor device gate being formed from a same material and concurrently with the dissimilar semiconductor device gate.

7. The method of claim 3 further comprising depositing a protective layer over the dissimilar semiconductor device gate prior to depositing the metal oxide thin film semiconductor device semiconducting layer.

8. The method of claim 1 further comprising forming electrically conducting interconnects between the metal oxide thin film semiconductor device and the dissimilar semiconductor device.

* * * * *